(12) United States Patent
Chan et al.

(10) Patent No.: US 7,972,178 B2
(45) Date of Patent: Jul. 5, 2011

(54) HIGH DENSITY CONNECTOR FOR INTERCONNECTING FINE PITCH CIRCUIT PACKAGING STRUCTURES

(75) Inventors: Benson Chan, Vestal, NY (US); David J. Alcoe, Hayward, WI (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 12/789,642

(22) Filed: May 28, 2010

(65) Prior Publication Data

US 2010/0323558 A1 Dec. 23, 2010

Related U.S. Application Data

(60) Provisional application No. 61/218,653, filed on Jun. 19, 2009.

(51) Int. Cl.
*H01R 31/06* (2006.01)
(52) U.S. Cl. ....................................................... 439/628

(58) Field of Classification Search .................. 439/628, 439/65, 66, 68–71, 74
See application file for complete search history.

(56) References Cited

U.S. PATENT DOCUMENTS

| 5,468,996 A | * | 11/1995 | Chan et al. | 257/723 |
| 5,730,620 A | * | 3/1998 | Chan et al. | 439/526 |

* cited by examiner

*Primary Examiner* — Javaid Nasri
(74) *Attorney, Agent, or Firm* — Mark Levy; Lawrence R. Fraley; Hinman, Howard & Kattell

(57) ABSTRACT

A pinned interposer and mating sockets to facilitate removable mounting of high connection density micro devices between a pair of substrates in compact electronic circuit packages. The pinned interposer has an inner set of contacts, typically in a rectangular array, that, in cooperation with a mating socket, allows pluggable connection of a micro device such as a MEMS device connected to a first printed circuit substrate. An outer set of contacts on the interposer provides electrical interconnection between the first substrate and a second substrate located atop the high connection density micro device, thereby effectively sandwiching the micro device between the first and second substrates. The outer set of contacts may be disposed in a circular array.

10 Claims, 3 Drawing Sheets

HIGH DENSITY CONNECTOR FOR INTERCONNECTING FINE PITCH CIRCUIT PACKAGING STRUCTURES

RELATED APPLICATIONS

This application claims the benefit of Provisional U.S. patent application Ser. No. 61/218,653, filed Jun. 19, 2009 and claims priority thereto in accordance with 37 C.F.R. §1.78.

FIELD OF THE INVENTION

The invention pertains to high density electrical connectors and, more particularly, to a high density connector having enhanced testing and rework capabilities for use in interconnecting fine pitch circuit packaging structures.

BACKGROUND OF THE INVENTION

Modern circuit packaging typically involves interconnecting multi-pin electronic components to cards or other circuit support structures. Often, such multi-pin components are connected directly to such support structures using well-known techniques such as ball grid array (BGA) surface mount chip packages that utilize a grid of solder balls as connectors. BGA packages are noted for their compact size, high lead count potential and low inductance. BGA chips are typically easier to align to the printed circuit board, because the leads, which are called "solder balls" or "solder bumps," are farther apart than leaded packages. Because the leads are underneath the chip, BGA has led the way to chip scale packaging (CSP) where the package is typically not more than 1.2× the size of the semiconductor die itself. However, after a solder reflow process is accomplished, BGA packages are permanently attached to the support structure.

A potential problem exists when soldering BGA devices to substrates. It is important that sufficient heat be applied to ensure that all the balls in the grid melt sufficiently for every joint to be formed and create metallurgical bonds between corresponding metal pads and the solder balls. Good process control usually avoids any such problems, however, the devices and joints cannot be fully tested by initially checking the electrical performance after soldering. It is possible that, over time, the joint or the device utilizing the solder joint connection, may fail. Further, a complex electronic assembly may utilize many devices, each of which may fail or inadequately perform during burn-in processing or other quality testing, when tested as a complete system assembly.

It is not possible to view the soldered connections using optical techniques. The only satisfactory means of inspection is to use X-ray inspection as this means of inspection allows inspection through the device itself at the soldered joints therebeneath. Further, despite known good die or device testing, it is not always possible to predict adequate performance of an assembly until it is fully assembled and tested in-situ.

As might be anticipated, it is not easy to rework boards containing BGAs unless the correct equipment is available. If a BGA is suspected as being faulty, it is possible to remove the device. This is achieved by locally heating the device to melt the solder underneath it. In the BGA rework process, heating is often achieved at a specialized rework station having a jig fitted with an infrared heater, a thermocouple to monitor the temperature, and a vacuum device for lifting the package. Great care is needed to ensure that only the BGA is heated and removed. Other devices nearby should be only minimally affected to avoid damage thereto.

As electronic packages shrink and component density of packaging structures increases, the effective use of BGA packages may be compromised, particularly under circumstances where rework is probable. This is particularly true if the device being removed or neighboring devices are particularly heat sensitive.

In development environments yet another constraint exists. If only a few components (e.g., prototype or pre-production chips) are extant, it may be necessary to use those few available chips to test a relatively large number of package assemblies. Consequently, it is necessary to avoid any packaging technique wherein the chips are permanently attached to the package assembly. Further, it may also be important that pin connections be accessible for testing or other evaluation. Packaging structures of the prior art have been ineffective in meeting these challenging demands.

It would, therefore, be desirable to provide a connector that allows easy interchangeability of high connection density devices in sub-assembles while providing ready access to connections for in situ testing of devices and/or circuits.

SUMMARY OF THE INVENTION

In accordance with the present invention there is provided a pinned interposer and mating sockets to facilitate removable mounting of high connection density micro devices in compact electronic circuit packages. The pinned interposer has an inner set of contacts, typically in a rectangular array, that, in cooperation with a mating socket, allow pluggable connection of a micro device to a first printed circuit (PC) substrate. For purposes of disclosure, a MEMS device has been chosen. An outer set of contacts of the novel interposer provides electrical interconnection between the first PC substrate and a second PC substrate located atop the high connection density micro device, thereby effectively sandwiching the micro device between the first and second substrates. In the example chosen for purposes of disclosure, the outer set of contacts is disposed in a circular array.

It is, therefore, an object of the invention to provide an interposer for allowing pluggable interconnection of a high connection density micro device sandwiched between upper and lower circuit substrate.

It is another object of the invention to provide an interposer for allowing pluggable interconnection of a high connection density micro device wherein an inner set of contacts allows connection of the micro device to a first circuit substrate.

It is a further object of the invention to provide an interposer for allowing pluggable interconnection of a high connection density micro device wherein an inner set of contacts may be disposed in a rectangular or square array.

It is an additional object of the invention to provide an interposer for allowing pluggable interconnection of a high connection density micro device wherein an outer set of contacts allows interconnection of the first and second substrates.

It is still another object of the invention to provide an interposer for allowing pluggable interconnection of a high connection density micro device wherein an outer set of contacts may be disposed in a circular array.

It is a further object of the invention to provide an interposer for allowing pluggable interconnection of a high connection density micro device wherein the micro device may readily be removed from the sandwiched circuit assembly.

It is still a further object of the invention to provide an interposer for allowing pluggable interconnection of a high connection density micro device wherein the pin structure allows ready access to signals to facilitate in situ testing.

It is yet another object of the invention to provide an interposer for allowing pluggable interconnection of a high connection density micro device wherein ball grid array mounting techniques are eliminated to allow connection of heat sensitive micro circuit devices.

BRIEF DESCRIPTION OF THE DRAWINGS

Various objects, features, and attendant advantages of the present invention will become more fully appreciated as the same becomes better understood when considered in conjunction with the accompanying drawings, in which like reference characters designate the same or similar parts throughout the several views, and wherein.

DETAILED DESCRIPTION OF THE PREFERRED EMBODIMENT

The present invention encompasses a connector system incorporating a unique interposer. The novel connector system allows removable insertion of a micro electronic device, for example, a MicroElectroMechanical systems (MEMS) device. While a MEMS device has been chosen for purposes of disclosure, the novel connector structure is not limited to use therewith. Rather, the invention covers the socket adapted for use with any similar high connection density microelectronic device. Further, the circuit package chosen for purposes of disclosure has a circular configuration. It will be understood that the novel interposer and socket system, however, may be used in circuit packages having other than circular configurations. Consequently, the invention is not limited to the circular package chosen for purposes of disclosure. Rather, the invention includes any circuit package overall shape.

Figure 1:
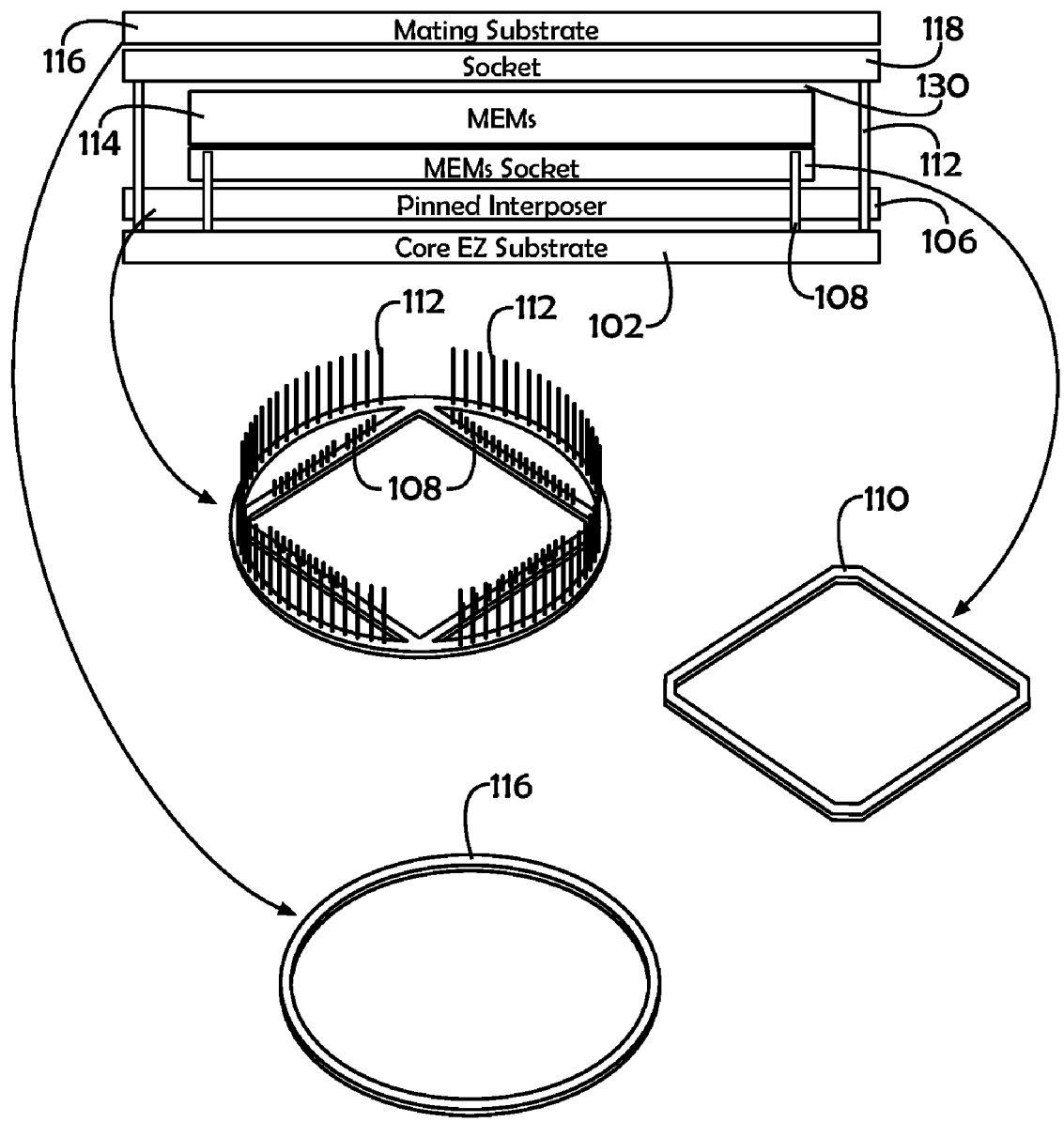
FIG. 1 is a side, elevational, schematic view of a circuit package including the connector in accordance with the invention with the components thereof shown in an exploded, perspective view.

Referring first to FIG. 1, there is shown a side elevational, schematic view of a circuit package including the interposer/socket connector in accordance with the invention with the components thereof shown in an exploded, perspective view, generally at reference number 100.

A lower substrate 102 forming no part of the present invention supports and is electrically connected to interposer 106. Inner pins 108 of interposer 106 are electrically connected to lower substrate 102 using conventional connection techniques believed known to those of skill in the art and not further discussed herein. As may be observed, inner pins 108 are disposed in a substantially rectangular or square configuration.

A compatible substrate socket 110 is adapted for placement on inner pins 108 atop interposer 106 and fits within outer pins 112 of the interposer 106. Socket 110 receives pins from MEMS device 114 and inner pins 108 of interposer 106 to establish a reliable electrical connection therebetween. Typically, socket 110 is permanently or semi-permanently connected to MEMS device 114 through the use of adhesive or solder indicated by reference number 130; however, other arrangements may be possible. Such arrangements are believed to be known to those of skill in the circuit packaging arts and, consequently, are not further discussed herein.

A MEMS device 114 is either plugged into, and possibly permanently connected to, substrate socket 110 and is thereby electrically connected to lower substrate 102.

An upper substrate 116 having a socket 118 disposed on its lower surface, is positioned above MEMS device 114. Socket 118 is configured to receive the upper ends of outer pins 112 of interposer 106, thereby electrically interconnecting upper substrate 116 and lower substrate 102. It will be noted that for purposes of disclosure, lower substrate 102, upper substrate 116 and interposer are circular. It will be recognized that this circular shape, chosen for use in a particular operating environment, is irrelevant to the inventive structure. Consequently, the invention is not considered limited to connectors having circular shapes. Rather, the invention includes connector systems having any outside shape.

It will be noted that outer pins 112 are preferably longer than inner pins 108 and are disposed around the perimeter of interposer 106 in a circular pattern. The placement of longer (i.e., outer) pins around the perimeter of interposer 106 serves two purposes. First, such a placement minimizes socketing stresses during assembly. With such a placement, de-socketing loading may readily be applied to the edge of the substrate without causing significant substrate flexure. Such placement of outer pins 112 also allows optimization of component placement and component routing with respect to pin pad locations. However, it will be recognized that in alternate embodiments, other relationships of placement of inner pins 108 and outer pins 112 are possible. It is further possible that the lengths of inner pins 108 and outer pins 112 could be reversed. Consequently, the invention is not considered limited to the pin placements or length relationships between inner pins 108 and outer pins 112 chosen for purposes of disclosure. Rather, the invention is intended to include any pin arrangement and/or length relationship between long and short pins.

It should be further noted that a reversal of the long and short pins (i.e., outer pins 112 and inner pins 108) may require that the substrate, not specifically identified, of interposer 106 may need to be constructed in a manner so as to resist flexing during socketing and, more particularly, during de-socketing operations.

Figure 2:
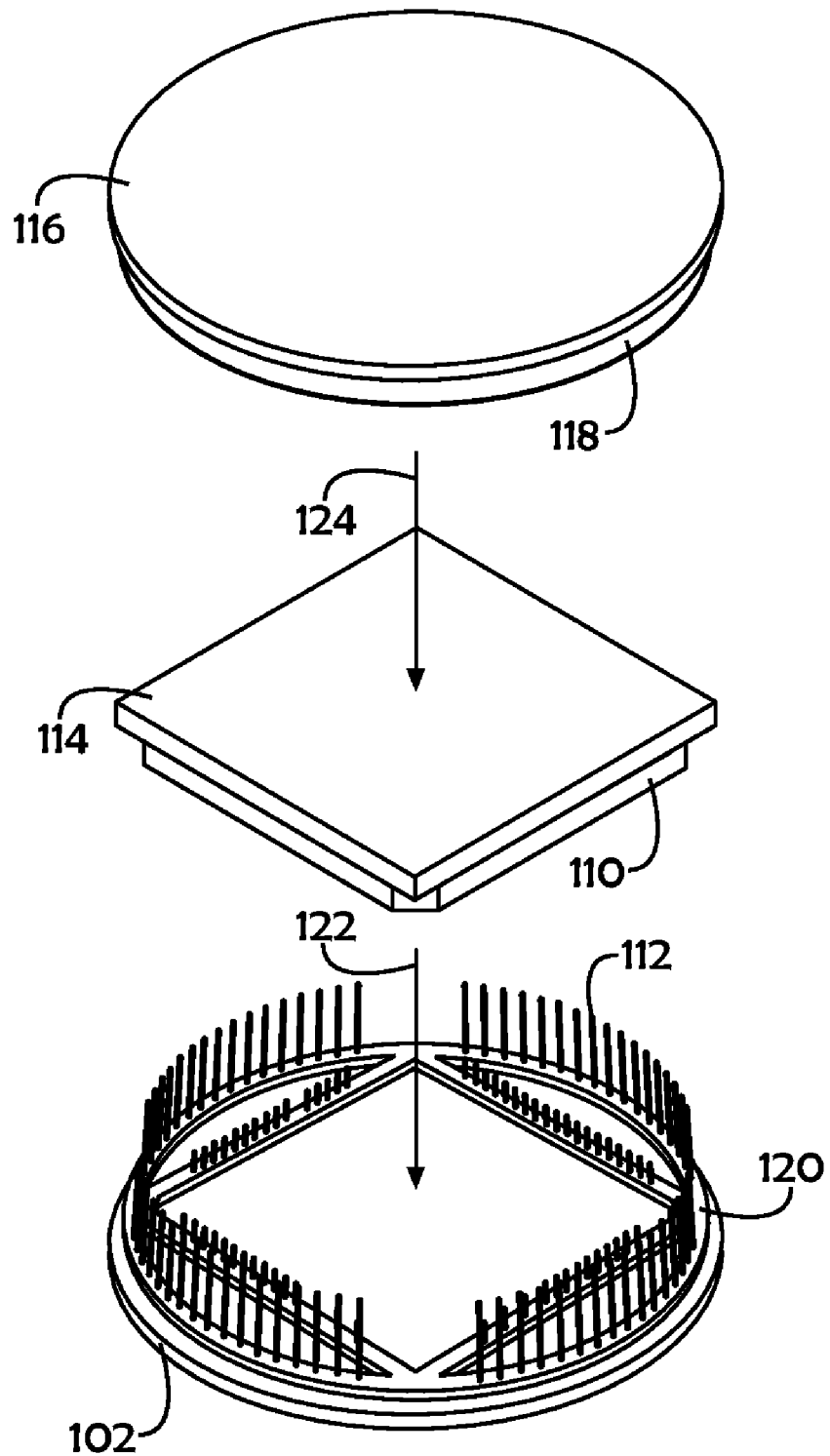
FIG. 2 is a detailed, exploded, schematic view showing the interposer portion of the connector attached to both a lower and an upper substrate.

Referring now also to FIG. 2, there is shown a detailed, exploded view showing interposer 106, upper substrate 116 with upper substrate socket 118 attached thereto, MEMS device 114 with lower socket 110 attached thereto, and lower substrate 102.

Interposer 106 is disposed on an upper surface of lower substrate 102 and electrically connected thereto by lower extremities, not shown, of both inner pins 108 and outer pins 112. Optionally, underfill 120 may be used. The use of underfill 120 is believed to be well understood by those of skill in the circuit packaging arts and, consequently, is not described in detail herein.

MEMS device 114 with attached socket 110 is shown positioned for placement onto inner pins 108 of interposer 106 as shown by direction arrow 122.

Upper substrate 116 with attached socket 118 is shown positioned for placement onto the upper extremities of outer pins 112 of interposer 106 in a direction shown by arrow 124.

Figure 3:
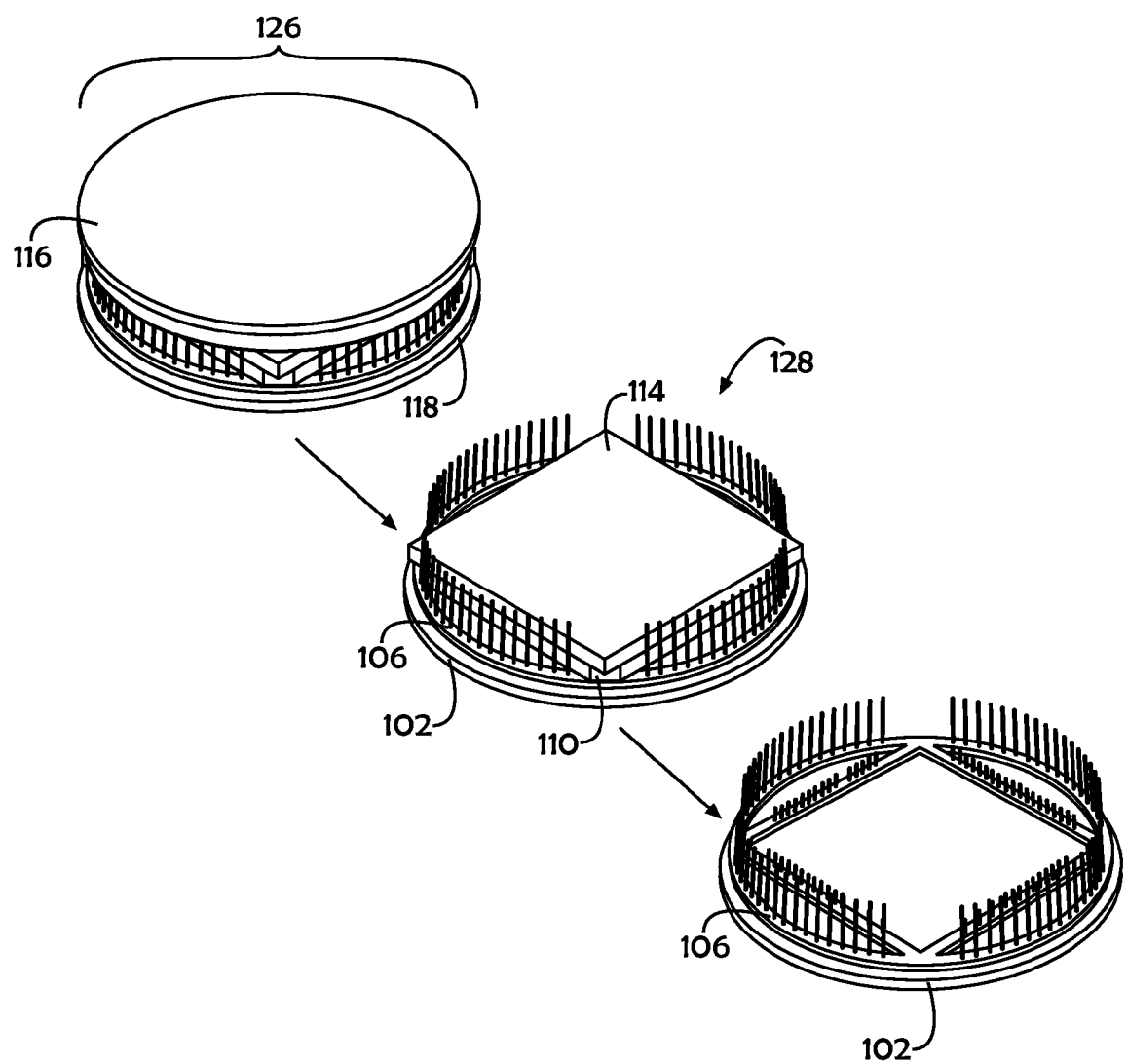
FIG. 3 is a progressive, perspective, schematic view illustrating a dis-assembly sequence of a circuit package allowing removal of a micro electronic device socketed therein.

Referring now to FIG. 3, there is shown a progressive, perspective view illustrating a dis-assembly sequence of a circuit package 126 allowing removal of MEMS device 114 therefrom. The completely assembled circuit package 126 includes both upper and lower substrates 116, 102, respectively, sockets 110 and 118, interposer 106, and MEMS device 114.

Upper substrate 116 with socket 118 is first unplugged from interposer 106 leaving lower circuit sub-assembly 128 consisting of lower substrate 102, interposer 106, socket 110, and MEMS device 114.

MEMS device 114 with socket 110 may next be removed leaving only interposer 106 connected to lower substrate 102 as shown.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A connector for attaching a high connection density micro device to a pair of spaced-apart substrates, comprising:
    a) an interposer having a substantially planar body and an outer set of contacts disposed in a first pattern adjacent a perimeter thereof, said outer set of contacts each having a lower portion projecting below a lower surface of said body and an upper portion having a first length projecting above an upper surface of said body and an inner set of contacts disposed in a second pattern inwardly of said outer set of contacts, each of said inner set of contacts having said lower portion projecting below said lower surface of said body and said upper portion having a second length projecting above said upper surface of said body, said second length being shorter than said first length;
    b) an upper socket having a first pattern of contacts disposed on a lower surface thereof and adapted to receive distal ends of said outer set of contacts therein; and
    c) a lower socket having a second pattern of contacts adapted to receive distal ends of said inner set of contacts at a lower surface thereof and a set of contacts adapted to removably receive a micro electronic device therein.

2. The connector for attaching a high connection density micro device to a pair of spaced-apart substrates as recited in claim 1, wherein said outer set of contacts is disposed in a substantially circular array.

3. The connector for attaching a high connection density micro device to a pair of spaced-apart substrates as recited in claim 2, wherein said inner set of contacts is disposed in a substantially rectangular array.

4. The connector for attaching a high connection density micro device to a pair of spaced-apart substrates as recited in claim 3, wherein said substantially rectangular array matches a pin array of a micro electronic device to be received therein.

5. The connector for attaching a high connection density micro device to a pair of spaced-apart substrates as recited in claim 1, wherein said inner set of contacts is disposed in a substantially rectangular array.

6. The connector for attaching a high connection density micro device to a pair of spaced-apart substrates as recited in claim 5, wherein said substantially rectangular array matches a pin array of a micro electronic device to be received therein.

7. The connector for attaching a high connection density micro device to a pair of spaced-apart substrates as recited in claim 5, further comprising a lower socket assembly comprising means for permanent attachment to a micro electronic device.

8. The connector for attaching a high connection density micro device to a pair of spaced-apart substrates as recited in claim 1, wherein said upper socket comprises means for permanent attachment thereof to an upper circuit substrate.

9. A method for removably connecting a micro electronic device between a pair of planar circuit substrates, the steps comprising:
    a) providing a connector comprising:
        i) an interposer having a substantially planar body and an outer set of contacts disposed in a first pattern adjacent a perimeter thereof, said outer set of contacts each having a lower portion projecting below a lower surface of said body and an upper portion having a first length projecting above an upper surface of said body, and an inner set of contacts disposed in a second pattern inwardly of said outer set of contacts, each of said inner set of contacts having said lower portion projecting below said lower surface of said body and said upper portion having a second length projecting above said upper surface of said body, said second length being shorter than said first length;
        ii) an upper socket having a first pattern of contacts disposed on a lower surface thereof and adapted to receive distal ends of said outer set of contacts therein; and
        iii) a lower socket having a second pattern of contacts adapted to receive distal ends of said inner set of contacts at a lower surface thereof and a set of contacts adapted to receive a micro electronic device removably therein;
    b) connecting said lower portions of said outer set and said inner set of pins to a first substrate;
    c) connecting said upper socket to a second substrate;
    d) connecting a micro electronic device to said lower socket;
    e) plugging said lower socket connected to said micro electronic device onto said inner set of pins; and
    f) plugging said upper socket onto said outer set of pins.

10. The method for removably connecting a micro electronic device between a pair of planar circuit substrates as recited in claim 9, wherein said connecting step (d) comprises permanently connecting said lower socket to said micro electronic device.

\* \* \* \* \*